US010176957B2

(12) United States Patent
Niehoff

(10) Patent No.: US 10,176,957 B2
(45) Date of Patent: Jan. 8, 2019

(54) ALTERNATING CURRENT CIRCUIT BREAKER WITH SELF-TEST CAPABILITY

(71) Applicant: Eaton Industries (Netherlands) B.V., Hengelo (NL)

(72) Inventor: Ronaldus Niehoff, Oldenzaal (NL)

(73) Assignee: EATON INTELLIGENT POWER LIMITED, Dublin (IE)

( * ) Notice: Subject to any disclaimer, the term of this patent is extended or adjusted under 35 U.S.C. 154(b) by 393 days.

(21) Appl. No.: 15/103,927

(22) PCT Filed: Dec. 4, 2014

(86) PCT No.: PCT/EP2014/076620
§ 371 (c)(1),
(2) Date: Jun. 13, 2016

(87) PCT Pub. No.: WO2015/086437
PCT Pub. Date: Jun. 18, 2015

(65) Prior Publication Data
US 2016/0314928 A1    Oct. 27, 2016

(30) Foreign Application Priority Data

Dec. 12, 2013 (GB) .................................. 1322003.3

(51) Int. Cl.
*H01H 83/04* (2006.01)
*G01R 31/327* (2006.01)
(Continued)

(52) U.S. Cl.
CPC ......... *H01H 83/04* (2013.01); *G01R 31/3277* (2013.01); *H02H 3/335* (2013.01); *H01H 2071/124* (2013.01)

(58) Field of Classification Search
CPC ............... G01R 31/3277; H01H 1/226; H01H 2009/543; H01H 2009/546;
(Continued)

(56) References Cited

U.S. PATENT DOCUMENTS 5,715,125 A    2/1998 Neiger et al.
6,262,871 B1   7/2001 Nemir et al.
(Continued)

FOREIGN PATENT DOCUMENTS

EP    1916691 A2    4/2008
EP    2320535 A1 *  5/2011    ......... H01H 71/1081
(Continued)

*Primary Examiner* — Thienvu Tran
*Assistant Examiner* — Nicolas Bellido
(74) *Attorney, Agent, or Firm* — Leydig, Voit & Mayer, Ltd.

(57) ABSTRACT

A method of executing a self-test of an alternating current circuit breaker involves executing a self-test of the circuit breaker for each of a plurality of functional blocks, wherein a sequence and timing of the executing a self-test for each of the plurality of functional blocks is programmed in and executed under control of a processing unit, and entering a failure mode of the circuit breaker upon detection of a failure status in any one of the functional blocks. The alternating current circuit breaker includes a live line between a live supply connecting terminal and a live load connecting terminal, and a neutral line between a neutral supply connecting terminal and a neutral load connecting terminal, the plurality of functional blocks, and the processing unit, which is connected to the first and second galvanic separation switch, the bypass switch and the semiconductor switch element.

15 Claims, 2 Drawing Sheets

(51) Int. Cl.
*H02H 3/33* (2006.01)
*H01H 71/12* (2006.01)

(58) Field of Classification Search
CPC ....... H01H 2033/146; H01H 2071/124; H01H 2083/201; H01H 3/00; H01H 33/00; H01H 33/04; H01H 33/06; H01H 33/16; H01H 33/161; H01H 33/165; H01H 33/167; H01H 33/44; H01H 33/59; H01H 33/593; H01H 33/596; H01H 73/045; H01H 75/00; H01H 75/02; H01H 75/04; H01H 75/06; H01H 75/08; H01H 75/10; H01H 75/12; H01H 77/00; H01H 77/02; H01H 83/00; H01H 83/04; H01H 83/10; H01H 83/12; H01H 83/14; H01H 83/16; H01H 83/20; H01H 83/22; H01H 89/00; H01H 9/00; H01H 9/0271; H01H 9/14; H01H 9/30; H01H 9/34; H01H 9/38; H01H 9/42; H01H 9/46; H01H 9/54; H01H 9/541; H01H 9/542; H01H 9/547; H01H 9/56; H02H 1/0015; H02H 1/046; H02H 3/023; H02H 3/044; H02H 3/06; H02H 3/063; H02H 3/066; H02H 3/07; H02H 3/08; H02H 3/105; H02H 3/16; H02H 3/162; H02H 3/20; H02H 3/202; H02H 3/207; H02H 3/24; H02H 3/243; H02H 3/247; H02H 3/253; H02H 3/26; H02H 3/265; H02H 3/28; H02H 3/305; H02H 3/32; H02H 3/325; H02H 3/33; H02H 3/332; H02H 3/335; H02H 3/347; H02H 3/353; H02H 3/36; H02H 3/52; H02H 5/041; H02H 5/048; H02H 7/0856; H02H 7/222; H02H 9/005; H02H 9/021; H02H 9/025; H02H 9/046; H02H 9/047; H02H 9/06

USPC ............ 361/2–13, 42, 86, 87, 92, 93.4, 115
See application file for complete search history.

(56) References Cited

U.S. PATENT DOCUMENTS

| | | | |
|---|---|---|---|
| 6,643,112 B1* | 11/2003 | Carton | H01H 9/54 218/3 |
| 7,262,945 B2* | 8/2007 | Galang | H02H 3/207 361/90 |
| 9,947,496 B2* | 4/2018 | Niehoff | H01H 9/542 |
| 2002/0181175 A1 | 12/2002 | Baldwin | |
| 2005/0243484 A1 | 11/2005 | Kim | |
| 2008/0013227 A1* | 1/2008 | Mernyk | H02H 3/335 361/42 |
| 2011/0063759 A1* | 3/2011 | Billingsley | H01H 9/541 361/1 |
| 2011/0102052 A1* | 5/2011 | Billingsley | H01H 9/542 327/365 |
| 2012/0032727 A1 | 2/2012 | Callanan | |
| 2012/0146655 A1 | 6/2012 | Suchoff | |
| 2013/0241677 A1 | 9/2013 | Padro | |
| 2016/0301200 A1* | 10/2016 | Niehoff | H02H 3/021 |
| 2016/0301204 A1* | 10/2016 | Niehoff | H02H 3/24 |

FOREIGN PATENT DOCUMENTS

| | | |
|---|---|---|
| JP | 2006014479 A | 1/2006 |
| WO | WO 2011018113 A1 | 2/2011 |

\* cited by examiner

ALTERNATING CURRENT CIRCUIT BREAKER WITH SELF-TEST CAPABILITY

CROSS-REFERENCE TO RELATED APPLICATIONS

This application is a U.S. national phase application under 35 U.S.C. § 371 of International Application No. PCT/EP2014/076620, filed on Dec. 4, 2014, and claims benefit to British Patent Application No. GB 1322003.3, filed on Dec. 12, 2013. The international application was published in English on Jun. 18, 2015, as WO 2015/086437 A1 under PCT Article 21(2).

FIELD

The present invention relates to an alternating current circuit breaker, such as a residual current device (RCD) or miniature circuit breaker (MCB), and to a method of executing a self-test of an alternating current circuit breaker.

BACKGROUND

RCDs with a self-test capability are available on the market. These devices however are usually either large and expensive or only test a part of the functionality of the entire device. Mostly mechanical parts as contacts, trip-units, mechanisms are not tested. The most reliable known self-test RCD has a double mechanism and bridges the first RCD part by a second RCD while the first is tested including the contacts and mechanical parts. However this solution, as e.g. described in the European patent application EP-A-1 916 691 is an expensive solution that requires a large amount of space.

A further prior art circuit breaker is known from U.S. Patent Application Publication No. 2002/181175, which discloses a digital fault interrupter (or Ground fault circuit interrupter GCFI) with self-testing capabilities. A controller is provided which periodically opens the contacts of the circuit breaker, and monitors a voltage over the load connected to the circuit breaker to check that the contacts have opened. However, further parts or functions of the GCFI are not tested.

SUMMARY

In an embodiment, the present invention provides a method of executing a self-test of an alternating current circuit breaker. The method includes executing a self-test of the circuit breaker for each of a plurality of functional blocks, wherein a sequence and timing of the executing a self-test for each of the plurality of functional blocks is programmed in and executed under control of a processing unit, and entering a failure mode of the circuit breaker upon detection of a failure status in any one of the functional blocks. The alternating current circuit breaker includes a live line between a live supply connecting terminal and a live load connecting terminal, and a neutral line between a neutral supply connecting terminal and a neutral load connecting terminal for connecting an alternating current load to a mains supply, the plurality of functional blocks, and the processing unit, the processing unit being connected to the first and second galvanic separation switch, the bypass switch and the semiconductor switch element. The plurality of functional blocks includes a bypass switch functional block comprising a bypass switch in the live line and associated operation circuitry, a first galvanic separation functional block comprising a first galvanic separation switch in the live line and associated operation circuitry, a second galvanic separation functional block comprising a second galvanic separation switch in the neutral line and associated operation circuitry, and a semiconductor switch functional block comprising a semiconductor switch element connected parallel to the bypass switch, and the processing unit, the processing unit being connected to the first and second galvanic separation switch, the bypass switch and the semiconductor switch element.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
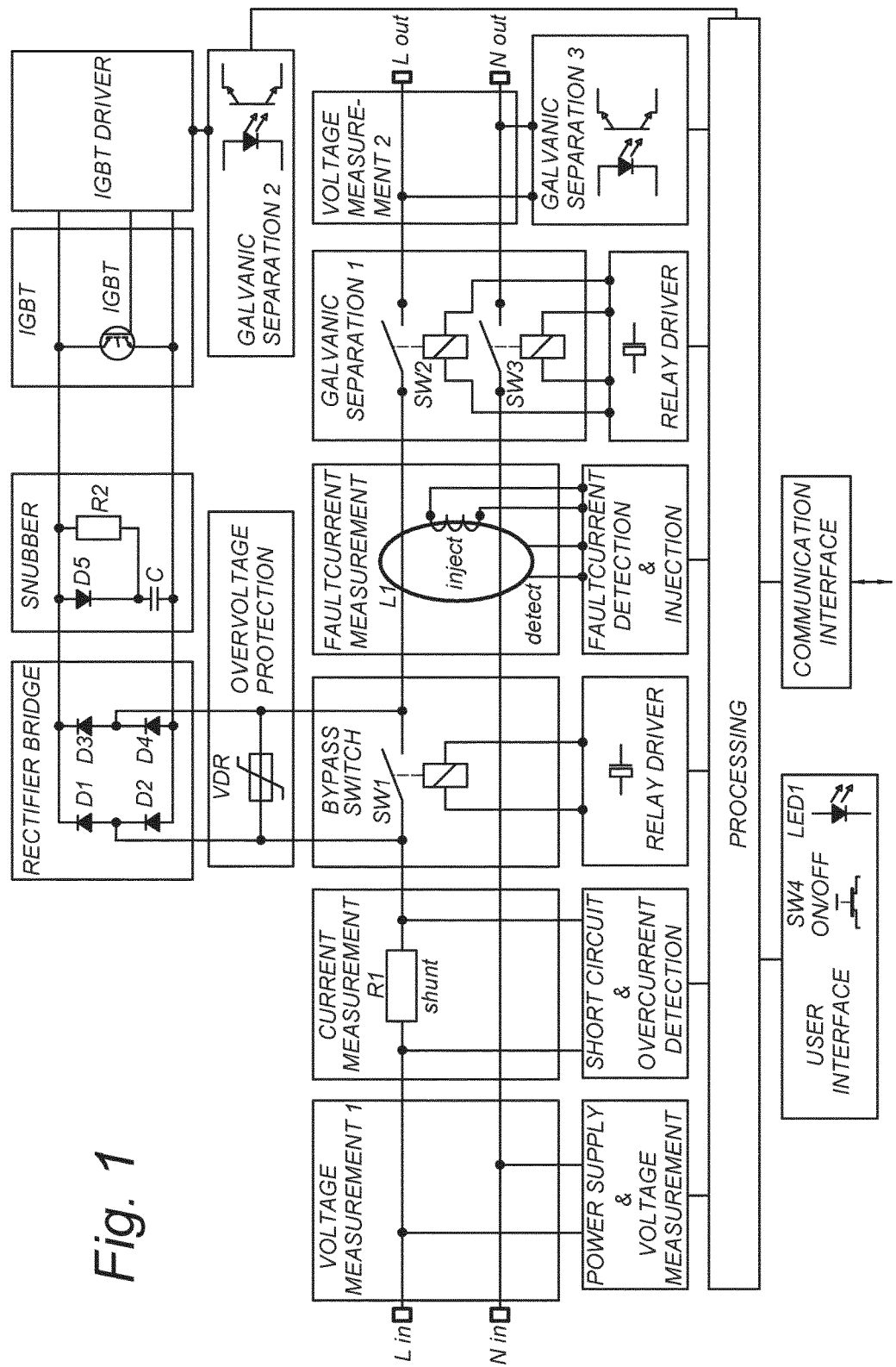
FIG. 1 shows a block diagram of an alternating current circuit breaker according to an embodiment of the present invention.

Embodiments of the present invention provide alternating current circuit breakers with a fail-safe self test capability and methods of operating such circuit breakers. According to an embodiment of the present invention, a method according to the preamble defined above is provided, wherein the circuit breaker has a plurality of functional blocks, the plurality of functional blocks comprising at least:

A bypass switch functional block including a bypass switch in the live line and associated operation circuitry;

A first galvanic separation functional block including a first galvanic separation switch in the live line and associated operation circuitry;

A second galvanic separation functional block including a second galvanic separation switch in the neutral line and associated operation circuitry; and A semiconductor switch functional block including a semiconductor switch element connected parallel to the bypass switch.

The circuit breaker further includes a processing unit connected to the first and second galvanic separation switch, the bypass switch and the semiconductor switch element. The method involves executing a self-test of the circuit breaker for each of the plurality of functional blocks, wherein the sequence and timing of the test of each of the plurality of functional blocks is programmed in and executed under control of the processing unit, and entering a failure mode of the circuit breaker upon detection of a failure status in any one of the functional blocks.

An embodiment of the invention provides a method for self-testing an alternating current circuit breaker which automatically does a functional test periodically. This method also allows the mechanical parts and contacts to be tested. The load power is not interrupted (noticeable to the load) or disturbed. If the circuit breaker detects a problem there are different scenarios possible, depending on specific demands.

Alternating current circuit breakers, in the form of a residual current device (RCD) or miniature circuit breaker (MCB) are safety related products of which the protection functionality even must be guaranteed for many years of use. RCD manufacturers prescribe periodic actuation of the test-button by the end-user, this is however in practice often not done. Because especially voltage independent RCD's have sensitive and low energy mechanism parts they are often not functional after years of no use/actuation. Field inspections which are done on regular base show that up to even more than 5% of the RCD's are defective. MCB's which are intended for overcurrent and short circuit protection are not tested at all in many situation as e.g. residential use. This is also not easily possible without professional test equipment and it is even not allowed by unskilled persons to perform MCB testing. Also the quality of the switching contacts is not checked, but after some short circuit disconnections this is often not acceptable anymore. Bad contacts can cause internal overheating.

In embodiments of alternating current circuit breakers of the present invention, all sub-circuits are tested periodically which is altogether a 100% self-check of the MCB and RCD functionality. If the processing unit of such a circuit breaker notices a problem there are different scenario's possible, depending on the customers' demands.

In FIG. 1 a block diagram is shown of an embodiment of a circuit breaker according to an embodiment of the present invention. The alternating current circuit breaker comprises a live line between a live supply connecting terminal Lin and a live load connecting terminal Lout, and a neutral line between a neutral supply connecting terminal Nin and a neutral load connecting terminal Nout for connecting an alternating current load to a mains supply AC. The circuit breaker comprises a first galvanic separation switch SW2 and a bypass switch SW1 in the live line, a second galvanic separation switch SW3 in the neutral line, a semiconductor switch element IGBT connected parallel to the bypass switch SW1, and a processing unit arranged to control the first and second galvanic separation switch SW2, SW3, the bypass switch SW1 and the semiconductor switch element.

The alternating current circuit breaker further comprises a power supply unit (part of the block Power Supply & Voltage Measurement in FIG. 1) connected to the live supply connecting terminal (Lin) and to the neutral supply connecting terminal (Nin), and connected to the processing unit and further components of the alternating current circuit breaker for providing electrical operating power thereto. The circuit breaker may also be provided with a dedicated voltage measurement unit at the input side of the circuit breaker (live and neutral supply connecting terminals Lin, Nin), as part of the Power Supply & Voltage Measurement block in FIG. 1, or alternatively as a separate block. In addition, the circuit breaker may be provided with a voltage measurement block at the load side thereof, i.e. connected close to the live and neutral load connecting terminals Lout, Nout. As shown in the embodiment of FIG. 1, this second voltage measurement unit is connected to the processing unit via a further galvanic separation block.

A short circuit and overcurrent detection unit is optionally provided which is connected to the processing unit for determining a short circuit situation or overcurrent situation (e.g. using the shunt resistor R1 in the live line in the block labeled Current Measurement in FIG. 1). The processing unit is further arranged for tripping the alternating current circuit breaker by opening the bypass switch SW1 and semiconductor switch element IGBT after determination of a short circuit or overcurrent situation. The alternating current circuit breaker may further comprise a fault current detection and injection unit connected to the processing unit for determining a fault current situation, the fault current detection and injection unit being in galvanic separation to the live line and neutral line (e.g. using the coil L1 and transformer as indicated in the block Fault Current Measurement in FIG. 1). The processing unit is further arranged to trip the alternating current circuit breaker after determination of a fault current situation.

In the embodiment shown in FIG. 1, the semiconductor switch element comprises a combination of a rectifier bridge D1-D4 and an isolated gate bipolar transistor IGBT. Alternating current terminals of the rectifier bridge D1-D4 are connected in parallel to the bypass switch SW1, and direct current terminals of the rectifier bridge D1-D4 are connected to an emitter and a collector terminal of the isolated gate bipolar transistor IGBT.

The processing unit is connected to a current measurement unit arranged in the live line, and is arranged to control the bypass switch SW1, first and second galvanic separation switches SW2, SW3 and the conducting state of the isolated gate bipolar transistor IGBT in case of detection of a short circuit condition, as described above. The control of opening and closing the bypass switch SW1 and first and second galvanic separation switches SW2, SW3 by the processing unit is implemented using respective relay drivers connected to the processing unit as indicated in the block diagram of FIG. 1.

An embodiment of such a relay driver is shown for the bypass switch SW1 as operation circuitry controlling the bypass relay associated with the bypass switch SW1. In the circuit embodiment of FIG. 2 the bypass switch relay is a bi-stable magnetic latch type relay. There is no energy needed to keep it in the OFF or ON position. The relay has one coil and is driven by a short current pulse.

In the circuit above the ON command is given by de-energizing capacitor C1 (by H-bridge transistor/FET's T1 and T4). The OFF command is given by de-energizing capacitor C2 (by H-bridge transistor/FET's T2 and T3). The advantage of a separated ON and OFF command storage capacitor is that the commands can be given in a very fast sequence. This reduces the time between ON and OFF/OFF and ON. In some cases this time is crucial, e.g. in the following situation: The MCB is switched ON e.g. by a manual toggle. First the IGBT will start conducting and connects the load to the line voltage. After some time (when there is no short circuit detection) also the bypass relay will be switched ON. This is the normal ON-procedure (see also the description above). If directly after the bypass relay switch ON command a short circuit is detected, the bypass relay ON command is immediately stopped and an OFF command is given. This is also possible in the case that the armature of the bypass relay is already moving to the ON position. By this hierarchy/sequence there is no additional delay in the rare case of an OFF command due to a short circuit in the time frame of the normal bypass relay ON-procedure.

In a further embodiment, the alternating current circuit breaker further comprises an overvoltage protection element VDR connected in parallel to the bypass switch SW1. The overvoltage protection element, or overvoltage protection varistor VDR protects the bridge diodes D1-D4 and IGBT against too high overvoltage's after a short circuit disconnection. In the (inductive) load still a lot of energy may be remaining and this does result in a high peak voltage after the disconnection. This high peak voltage is absorbed by the varistor VDR. Of course the shorter the time frame for the disconnection is (fast bypass contact), the smaller the remaining energy in the mains load network is and the smaller the absorbed energy of the varistor VDR is.

In an even further embodiment, the alternating current circuit breaker further comprises a snubber circuit C, R2, D5 connected to the collector and emitter terminals of the isolated gate bipolar transistor IGBT. The snubber circuit is a standard RCD snubber to clamp the voltage during turning off the IGBT. The snubber circuit starts clamping directly after turn off and the varistor VDR at about 900V. Both take a part of the absorbed energy due to the remaining energy in the mains load network.

The rectifier bridge D1-D4 is needed since the IGBT is only conducting in one direction (transistor). It must carry the same current as the IGBT, so also a short circuit. Another solution would be to use to 'anti-parallel' IGBT's with series diodes (to carry the reverse voltage in the OFF state of the IGBT), but this would make the complete circuit more complex and expensive.

With the present state of the technology, no other semiconductor solutions are possible. There are FET's with a very low channel-resistance, but these are not available as both high voltage/high current type. Triacs and thyristors cannot be used since they are only able to turn off in the zero crossing and this takes too much time. In case of short circuit they cannot be easily forced to switch off and will blow up finally. GTO's (gate turn off thyristor) and IGCT (integrated gate-commutated thyristor) need a lot of energy to keep them in the ON state and to turn OFF. Also the driver circuit would be much more complex.

The processing unit is arranged to accommodate the measurement inputs, calculation software and output signal logic and drivers. Most time critical processes can be realized by an EPLD or logic ports, but most of the functionality can be integrated in a µP (microprocessor). Primary functions which are included in the processing unit, and which are explained in more detail below where necessary are:
- Mains voltage measurement (via the Power Supply & Voltage Measurement block).
- Mains current measurement & calculating overcurrent characteristic (for replacing the bimetal overcurrent protection).
- Mains voltage & current synchronization.
- Temperature measurement for different components in the MCB (e.g. IGBT and shunt resistor R1).
- Driver logic for the relay drivers (including energy monitor of the storage capacitors).
- Communication to the IGBT driver unit, user interface and communication interface.
- Programming/preset interface for programming (over) current characteristics and a calibration procedure.
- Internal storage of data in case of power interruptions (e.g. contact status, mains current history for the overcurrent protection).

The current measurement is done by a shunt. In an embodiment, the current measurement unit comprises a shunt resistor R1 in the life line and a short circuit and an overcurrent detection unit arranged to measure the voltage across the shunt resistor R1. A shunt is the most logic choice for this application since the accuracy and linearity is superior to other components. Also the size is small and price/availability is reasonable. An alternative would be a Rogowski coil which is also accurate over a wide range and in high current applications. The disadvantage is that a Rogowski coil is much bigger and the output signal is much lower which makes an integrated/combined design for short circuit protection and (small) current/energy measurement more difficult. The value of the shunt resistor R1 must be chosen such that at nominal load current there is a low dissipation, e.g. $45\text{ A}/100\mu\Omega \Rightarrow 0.2$ W. The shunt resistor R1 must be capable to withstand the short circuit current for a short time, e.g. $1.5\text{ kA}/100\mu\Omega/1.5\text{ ms} \Rightarrow 225$ W/0.34 Joule.

The short circuit and overcurrent detection may be implemented using an analog or digital circuit which must be fast enough to detect the short circuit. It also must be accurate enough to sense small load currents for energy measurement purposes. A logical solution is an opamp circuit or integrated (analog ASIC) circuit, but also digital circuits with a high sampling rate are possible.

The alternating current circuit breaker of a further embodiment further comprises an IGBT driver unit connected to the processing unit and a control input of the isolated gate bipolar transistor, wherein the IGBT driver unit is arranged to switch off the isolated gate bipolar transistor in a two-stage process. The IGBT driver unit may further be arranged to monitor the voltage across the IGBT.

The second galvanic separation circuit (Galvanic Separation 2 in the embodiment shown in FIG. 1) comprise one or more optocouplers for communication between the processing and IGBT driver unit. Also a small galvanic separated SMPS may be provided inside the IGBT driver unit to supply the IGBT driver circuit since this driver circuit is on another voltage potential than the other circuit parts of the circuit breaker.

The IGBT driver unit contains the following functions (possibly as separate circuits):
- Two step output driver of the IGBT
- Voltage (de-saturation) monitor of the IGBT collector-emitter voltage
- Bypass switch status monitor
- IGBT driver monitor
- IGBT ON/OFF input For turning off the IGBT in case of a short circuit disconnection, the IGBT driver unit will decrease the gate voltage of the IGBT in two steps. This action avoids both dangerous overvoltage across the IGBT, and SOA problems, especially at short circuit turn-off. The turn-off delay is about 1 µs; in this time the voltage level of the gate will be about half the normal on-voltage.

The bypass switch status monitor function detects whether the bypass switch SW1 is closed; this is done by checking the voltage across the IGBT. The status information of SW1 is forwarded to the processing unit, and can then be used for the delayed turn-off command for the IGBT in case of a short circuit.

The IGBT driver monitor checks power supply voltage of the driver circuit, this is forwarded to the processing unit. If this voltage is too low the IGBT will be in the off-state and this is a fail situation in normal operation. The IGBT ON/OFF input receives the ON/OFF command from the processing unit.

In a further embodiment, the alternating current circuit breaker further comprises a user interface connected to the processing unit. The user interface e.g. comprises a test switch SW4 and a status indicator. The user interface is e.g. only a push button or a toggle switch with some LEDs to signal the status of the MCB (Powered/ON/OFF/failure etc.).

Furthermore, the alternating current circuit breaker may comprise a communication interface connected to the processing unit, allowing remote operation and monitoring. The communication interface is used to send all possible data to any medium (e.g. bus-system, internet or RS485), wired or wireless (RF/IR).

Note that the configuration from the diagram shown in FIG. 1 and described herein is a 1 pole+N configuration (only overcurrent and short circuit protection in the phase). If a 2 pole device is needed a second bypass switch, overvoltage protection, rectifier bridge, snubber, IGBT and IGBT driver are included in a further embodiment. Also more complex configurations of the mains supply with multiple poles (e.g. 3 phase, 3 phase+neutral, or even 4 phase) can be accommodated by further embodiments with associated additional components.

When an RCD or MCB is used in professional applications (e.g. industrial or commercial), it is normally inspected by service technicians by applying a fault- or overcurrent to the breaker. This test must be done on regular base to ensure the maximum availability of the protection function. In private/residential use an RCD can be tested by the test button, but an MCB (overcurrent/short-circuit protection device) cannot be tested at all. A test of a service technician is always a restricted test and only proves the correct functionality for that moment. This test cannot guarantee that the breaker is also functioning in the (near) future. How more often inspections are done, the lower is the risk for malfunction of the breaker, but this is of course expensive and labor-intensive. If the full breaker functionality must be checked, all parts of the construction and electronics circuit must be included, even the mechanical contacts for the galvanic separation function. In the present invention embodiments of the circuit breaker (either in MCB or RCD version) a 100% self-check is done in parts on the different blocks. This is done to have no high system load for this extra functionality and also the customer will not notice if the device is self-testing. The testing-blocks are defined by choosing independent circuits which are defined using an FMEA (Failure Mode Effect Analysis). They are not tested at the same moment and frequency, but in a programmable and/or intelligent sequence (defined by using Risk Analysis).

The present invention is embodied in a number of methods of executing a self-test of an alternating current circuit breaker, e.g. in the form of a MCB or a RCD. The circuit breaker comprises (see also FIG. 1 and the description thereof above) a live line between a live supply connecting terminal Lin and a live load connecting terminal Lout, and a neutral line between a neutral supply connecting terminal Nin and a neutral load connecting terminal Nout for connecting an alternating current load to a mains supply, as well as a plurality of functional blocks. The plurality of functional blocks comprises at least a bypass switch functional block comprising a bypass switch SW1 in the live line and associated operation circuitry; a first galvanic separation functional block comprising a first galvanic separation switch SW2 in the live line and associated operation circuitry; a second galvanic separation functional block comprising a second galvanic separation switch SW3 in the neutral line and associated operation circuitry; and a semiconductor switch functional block comprising a semiconductor switch element IGBT connected parallel to the bypass switch SW1. For the bypass switch SW1 and galvanic separation switches, the associated operation circuitry may be implemented as a relay and a relay driver (see e.g. FIG. 2 and description above).

The circuit breaker further comprises a processing unit connected to the first and second galvanic separation switch SW2, SW3, the bypass switch SW1 and the semiconductor switch element IGBT. The present invention method embodiments comprise executing a self-test of the circuit breaker for each of the plurality of functional blocks, wherein the sequence and timing of the test of each of the plurality of functional blocks is programmed in and executed under control of the processing unit, and entering a failure mode of the circuit breaker upon detection of a failure status in any one of the functional blocks. Entering the failure mode can comprise failure signaling, a fail-safe principle of operation or a preventive action, and e.g. comprises controlling the first and second galvanic separation switches (SW2, SW3) to open (i.e. disconnect the load connected to the circuit breaker), or alternatively controlling all switches SW1, SW2, SW3, IGBT to open, under control of the processing unit. In a further embodiment, the alternating current circuit breaker further comprises a communication interface connected to the processing unit, and entering the failure mode comprises transmitting a failure message via the communication interface. In addition, or alternatively, transmitting a failure message further comprises providing a visual and/or oral warning signal, e.g. using the LED in the user interface of the embodiment of FIG. 1.

These types of entering the failure mode may be applied to any of the following sub-circuits, associated with the functional blocks as identified above. In case of too high tolerances or when an uninterrupted power supply to the load connected to the circuit breaker must be guaranteed there is a possibility of only using the communication interface or user interface options for a certain time period (programmable). Also a retesting cycle can be performed using an embodiment wherein execution of the self-test further comprises executing a retest of a functional block with a failure status before entering the failure mode.

| Block name (sub-circuits) | Functionality tested | Test-method |
| --- | --- | --- |
| Overcurrent detection (shunt, overcurrent detection circuit) | Shunt resistance Analog detection circuit Full path from current to processing unit Internal wiring | Injecting one or different currents by separate injection circuit which is driven by the processing unit. The test-current is added to the normal load current or applied in an OFF situation of the breaker or during testing of SW2/SW3. |
| Faultcurrent detection (detection coil, faultcurrent detection circuit) | Faultcurrent sensitivity Detection coil parameters Detection coil wiring Analog detection circuit Full path from faultcurrent to processing unit Internal wiring | Injecting one or different fault-currents by separate injection circuit which is driven by the processing unit. The test-current is added to the normal fault current (if any) or in an OFF situation of the breaker or during testing of SW2/SW3. |
| SW1 function (storage/buffer capacitors, H-bridge, relay SW1, contact-opening SW1) | Storage/buffer capacitors voltage and health H-bridge functionality Mechanical and electrical part of SW1 Contact opening of SW1 Time delay of the contact Reliable ON and OFF switching Internal wiring | Test is made in normal service of the MCB/RCD by shortly (e.g. 10 ms) opening SW1 by using the SW1-OFF and SW1-ON command of the processing unit. The IGBT takes over the load current. By measuring the voltage across the IGBT (IGBT driver with link to the processing unit) the SW1 function and timing can be checked. |

-continued

| Block name (sub-circuits) | Functionality tested | Test-method |
|---|---|---|
| SW2 function (storage/buffer capacitors, H-bridge, relay SW2, contact-opening SW2) | See SW1 function | Test is made in normal service of the MCB/RCD by shortly (<10 ms) ) opening SW2 by using the SW2-OFF and SW2-ON command of the processing unit. The load current is interrupted for e.g. a maximum of 10 ms which will not be noticed by the load. By measuring the load voltage (voltage measurement 2 with connection to the processing unit) the SW2 function and timing can be checked. This test is performed in low load situations |
| SW3 function (storage/buffer capacitors, H-bridge, relay SW3, contact-opening SW3) | See SW1 function | See SW2. SW3 is not tested at the same time as SW2 |
| Hybrid switch (IGBT, rectifier bridge, IGBT-driver) | IGBT OFF-ON performance Rectifier bridge diodes IGBT driver ON-OFF performance Internal wiring | In the test sequence of testing SW1 also for a very short period the IGBT is opened (e.g. 2 . . . 10 ms). This is done in both polarities of the mains voltage/current to check all diodes. This is done in the OFF-period of SW1 during the self-test. By measuring the load voltage (voltage measurement 2 with connection to the processing unit) the hybrid switch function and timing can be checked. This test is preferably performed in low load situations |

The test embodiments can also be described as follows:

The plurality of functional blocks further comprises a short circuit and overcurrent detection functional block connected to the processing unit, and the processing unit is further arranged to execute a self-test of the short circuit and overcurrent detection functional block by injection of a predetermined current in the live line, e.g. using the current injection circuit controlled by the processing unit The plurality of functional blocks comprises a faultcurrent detection functional block connected to the processing unit, and the processing unit is further arranged to execute a self-test of the faultcurrent detection functional block by injection of a predetermined current in the live line (more specifically in the detection coil L1, using the faultcurrent injection circuit controlled by the processing unit as depicted in FIG. 1).

Execution of the self-test of the bypass switch functional block in a further embodiment comprises to open the bypass switch SW1 for a period of less than about 10 ms during normal operation, and to monitor a voltage across the semiconductor switch element. When opening the bypass switch SW1, the IGBT takes over the current, allowing to also measure the voltage across the IGBT.

In addition, or alternatively, execution of the self-test of the first or second galvanic separation switch functional blocks comprises to open the first or second galvanic separation switch SW2, SW3 for a period of less than about 10 ms during normal operation, and to monitor a voltage between the live load connecting terminal (Lout) and the neutral load connecting terminal (Nout). Note that the first and second galvanic separation switch functional blocks are tested subsequently. Also, the galvanic separation switches SW2 and SW3 have a high speed ON and OFF performance, and using the timing of below 10 ms power interruptions, in general a load connected to the circuit breaker being tested will not notice a power failure.

Execution of the self-test of the semiconductor switch functional block comprises to open the semiconductor switch element IGBT for a short duration (e.g. 2-5 ms), during the period wherein the bypass switch SW1 is opened, and to monitor a voltage between the live load connecting terminal Lout and the neutral load connecting terminal Nout. The execution of the self-test of the semiconductor switch functional block may be executed in both a positive half period and a negative half period of the mains supply, which allows to test all diodes of the rectifier bridge in the embodiment shown in FIG. 1.

Also further functional blocks may be included in the testing of the circuit breaker:

| Power supply (sub-supplies, references) Processing unit (RTC, μC, memory, logic parts, firmware) | Supply voltage levels Reference voltage levels μC software loop Write/read memory RTC Functionality logic parts | Constant monitoring voltages by A/D input of processing unit Usual methods (e.g. watchdog/life-guard) for checking digital circuits |
|---|---|---|

In an embodiment the plurality of functional blocks further comprises a power supply connected to elements of the alternating current circuit breaker for providing operating power thereto, and the processing unit is arranged to execute the self-test of the power supply continuously. In a further embodiment, the processing unit is arranged to execute a self-test of the processing unit itself in a continuous manner.

Figure 2:
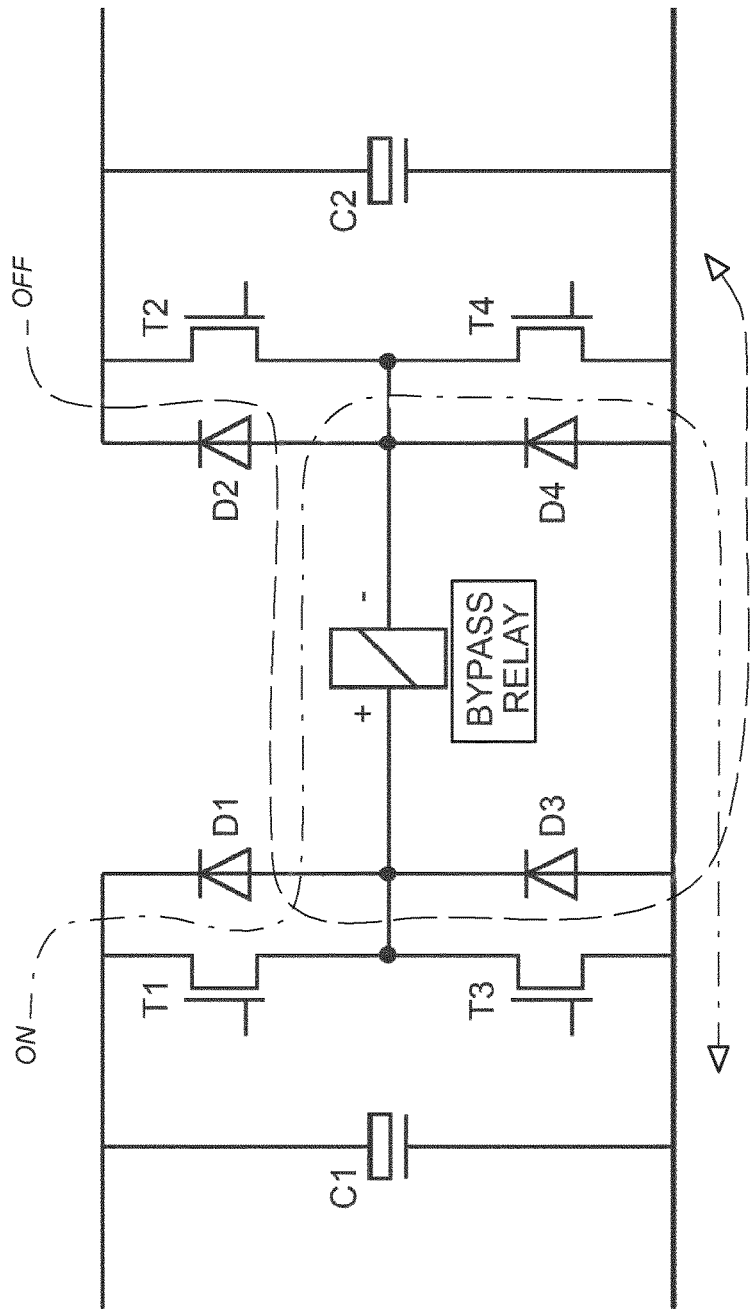
FIG. 2 shows a schematic diagram of an embodiment of the relay driver of the alternating current circuit breaker of FIG. 1.

For testing of the power supply and processing unit, fail-safe actions (switching off the galvanic separation switches SW2, SW3 or all switches) are guaranteed also in case of absence of (one of the) supply voltage(s) or malfunction of the processing unit by the design of the buffer capacitor H-bridge drivers (see FIG. 2 and description above). Also in these sub-tests, in case of too high tolerances there is a possibility of only performing the actions using the communication interface and/or user interface only for a certain period (programmable).

Finally, also the communication interface can be included in the test, using testing methods which are as such known for communication interfaces.

| Communication interface (communication chip, network) | Two way communication Network performance | Usual methods (e.g. send/receive) for checking communication circuits |
|---|---|---|

It is noted that the above mentioned block are not tested at the same time and in the same frequency. For some of the blocks the failure risk is higher, e.g. a failure in the power supply and processing unit must directly lead to a device failure mode and (at least) disconnection of the load. These blocks must be monitored continuously since there is only a limited time period were the buffer capacitor H-bridge drivers are able to disconnect all the switches SW1 . . . SW3, such that the Power supply and Processing unit have a constant fail-safe behavior.

For the other circuits/functional blocks constant testing is not possible (e.g. the switches SW1 . . . SW3), and these must be tested periodically. The frequency can be programmed and can be made dependent on various parameters, such as:

load current (in low load current situations a lower disturbance of the load is expected)
  day/night time
  events, e.g. after a short circuit
  temperature
  life time (e.g. after 10 years of use the test-frequency can be increased)
  long time MCB/RCD not used/OFF position
  after long periods of mains interruptions
  process risk when a failure occurs (e.g. medical applications)

It can also be done on request by a service technician by a remote controlled self-test request. Also the result (good/bad performance) can be communicated by the communication interface.

Note that in case of one failing switch SW1 ... SW3 there is always a backup load disconnection switch available (for bypass switch SW1: first galvanic separation switch SW2; for first galvanic bypass separation switch SW2: combination of bypass switch SW1 and IGBT; for second galvanic bypass separation switch SW3: first galvanic separation switch SW2).

If a failure is detected or a measured parameter is (nearly/moving to) out of tolerance the MCB/RCD status will change to the device failure mode. In case of serious problems this will directly result in a disconnection of the load and opening of all switches and IGBT. This failure mode will also be displayed on the front of the breaker by e.g. a LED and notified to the communication interface (if this is still possible).

Depending on the nature of the found failure it is also possible to program the acceptance of a temporary deviation/failure of the MCB/RCD, e.g. in the case that switching OFF the load is more dangerous than a missing protection function (e.g. medical application or traffic lights). Another reason for temporary not switching OFF the load can be that this would cause big process-disturbances or costs or in the case that there is still a second backup protection available. Especially when there is an error-communication possible by the communication interface and there is a professional service organization available within an acceptable time.

The internal failure handling scenario can also be used in case of load failure situations. If e.g. a constant faultcurrent is detected in networks were no faultcurrent protection is prescribed, for the same reasons as above it could be programmed that this is temporary accepted. It is even possible that in case of specific load problems by intelligent detection algorithms programmed in the processing unit of the present invention embodiments of the circuit breaker (either MCB or RCD variant) this particular load is recognized and by another switching device it is disconnected.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method of executing a self-test of an alternating current circuit breaker, the method comprising:
   executing a self test of the circuit breaker for each of a plurality of functional blocks, wherein a sequence and timing of the executing a self-test for each of the plurality of functional blocks is programmed in and executed under control of a processing unit, and
   entering a failure mode of the circuit breaker upon detection of a failure status in any one of the functional blocks,
   wherein the alternating current circuit breaker comprises:
   a live line between a live supply connecting terminal and a live load connecting terminal, and a neutral line between a neutral supply connecting terminal and a neutral load connecting terminal for connecting an alternating current load to a mains supply,
   the plurality of functional blocks, the plurality of functional blocks comprising:
     a bypass switch functional block comprising a bypass switch in the live line and associated operation circuitry;
     a first galvanic separation functional block comprising a first galvanic separation switch in the live line and associated operation circuitry;
     a second galvanic separation functional block comprising a second galvanic separation switch in the neutral line and associated operation circuitry; and
     a semiconductor switch functional block comprising a semiconductor switch element connected parallel to the bypass switch, and
   the processing unit, the processing unit being connected to the first and second galvanic separation switches, the bypass switch and the semiconductor switch element.

2. The method according to claim 1, wherein the entering the failure mode comprises controlling the first and second galvanic separation switches to open or controlling all switches to open.

3. The method according to claim 1, wherein the alternating current circuit breaker further comprises a communication interface connected to the processing unit, and
   wherein the entering the failure mode comprises transmitting a failure message via the communication interface.

4. The method according to claim 3, wherein the transmitting a failure message further comprises providing at least one of a visual warning signal or an oral warning signal.

5. The method according to claim 1, wherein the execution of the self-test further comprises executing a retest of a functional block with a failure status before entering the failure mode.

6. The method according to claim 1, wherein execution of the self-test of the bypass switch functional block comprises opening the bypass switch for a period of less than about 10 ms during normal operation and monitoring a voltage across the semiconductor switch element.

7. The method according to claim 1, wherein execution of the self-test of the first or second galvanic separation switch functional blocks comprises opening the first or second galvanic separation switch for a period of less than about 10 ms during normal operation, and monitoring a voltage between the live load connecting terminal and the neutral load connecting terminal.

8. The method according to claim 7, wherein the first and second galvanic separation switch functional blocks are tested subsequently.

9. The method according to claim 1, wherein execution of the self-test of the semiconductor switch functional block comprises opening the semiconductor switch element for a short duration, during the period wherein the bypass switch is opened, and monitoring a voltage between the live load connecting terminal and the neutral load connecting terminal.

10. The method according to claim 9, wherein the execution of the self-test of the semiconductor switch functional block is executed in both a positive half period and a negative half period of the mains supply.

11. The method according to claim 1, wherein the plurality of functional blocks comprises a short circuit and overcurrent detection functional block connected to the processing unit,
and wherein the processing unit is further arranged to execute a self-test of the short circuit and overcurrent detection functional block by injection of a predetermined current in the live line.

12. The method according to claim 1, wherein the plurality of functional blocks comprises a faultcurrent detection functional block connected to the processing unit,
and wherein the processing unit is further arranged to execute a self-test of the faultcurrent detection functional block by injection of a predetermined current in the live line.

13. The method according to claim 1, wherein the plurality of functional blocks further comprises a power supply connected to elements of the alternating current circuit breaker for providing operating power thereto, and
wherein the processing unit is arranged to execute the self-test of the power supply continuously.

14. The method according to claim 1, wherein the processing unit is arranged to execute a self-test of the processing unit itself in a continuous manner.

15. An alternating current circuit breaker comprising:
a live line between a live supply connecting terminal and a live load connecting terminal, and a neutral line between a neutral supply connecting terminal and a neutral load connecting terminal for connecting an alternating current load to a mains supply,
a plurality of functional blocks, the plurality of functional blocks comprising:
a bypass switch functional block comprising a bypass switch in the live line and associated operation circuitry;
a first galvanic separation functional block comprising a first galvanic separation switch in the live line and associated operation circuitry;
a second galvanic separation functional block comprising a second galvanic separation switch in the neutral line and associated operation circuitry; and
a semiconductor switch functional block comprising a semiconductor switch element connected parallel to the bypass switch, and
a processing unit, the processing unit being connected to the first and second galvanic separation switches, the bypass switch and the semiconductor switch element,
wherein the processing unit is configured to control a sequence and timing of execution of a self-test of the circuit breaker for each of the plurality of functional blocks, and
wherein the circuit breaker is configured to enter a failure mode upon detection of a failure status in any one of the functional blocks.

* * * * *